US008204255B2

(12) United States Patent
Grove

(10) Patent No.: US 8,204,255 B2
(45) Date of Patent: Jun. 19, 2012

(54) METHOD OF DISTORTION-FREE SIGNAL COMPRESSION

(75) Inventor: Craig Nicholas Grove, Dudley (GB)

(73) Assignee: Red Lion 49 Limited, Begbroke (GB)

( * ) Notice: Subject to any disclaimer, the term of this patent is extended or adjusted under 35 U.S.C. 154(b) by 823 days.

(21) Appl. No.: 12/264,355

(22) Filed: Nov. 4, 2008

(65) Prior Publication Data

US 2009/0116665 A1 May 7, 2009

(30) Foreign Application Priority Data

Nov. 7, 2007 (GB) .................................. 0721780.5

(51) Int. Cl.
*H03G 7/00* (2006.01)

(52) U.S. Cl. ......... 381/106; 381/104; 381/107; 381/312

(58) Field of Classification Search .......... 381/104–107, 381/312, 320–321, 71.14
See application file for complete search history.

(56) References Cited

U.S. PATENT DOCUMENTS

| | | | |
|---|---|---|---|
| 4,398,061 | A | 8/1983 | McMann, Jr. |
| 5,672,999 | A | 9/1997 | Ferrer et al. |
| 2005/0123152 | A1 | 6/2005 | Magrath |

FOREIGN PATENT DOCUMENTS

| | | | |
|---|---|---|---|
| GB | 1599401 | | 9/1981 |
| GB | 2201310 | A | 8/1988 |
| GB | 2378064 | A | 1/2003 |

*Primary Examiner* — Fernando L Toledo
*Assistant Examiner* — Mark A Laurenzi
(74) *Attorney, Agent, or Firm* — Richard M. Goldberg

(57) ABSTRACT

An audio signal in which an audio signal is received as a stream of digital samples, each being a numerical value representing a sampled signal level. A first zero crossing point is identified and the received audio samples are stored until a second zero crossing point is identified, thereby storing a first half-wave of samples. The highest intensity sample is identified from the stored samples and this is compared against a predetermined threshold. All stored samples are scaled by an initial scaling factor so that the intensity of the highest intensity sample is not above this threshold. A second half-wave of samples is stored in which all samples of the second half-wave are below the threshold. All stored samples of the second half-wave are also scaled but by a modified scaling factor derived from a combination of the initial scaling factor and a decay factor.

8 Claims, 8 Drawing Sheets

METHOD OF DISTORTION-FREE SIGNAL COMPRESSION

CROSS REFERENCE TO RELATED APPLICATIONS

This application claims priority from United Kingdom patent application number 07 21 780.5, filed Nov. 7, 2007, the whole contents of which are incorporated herein by reference in their entirety.

TECHNICAL FIELD

The present invention relates to compressing the level of an audio signal, primarily to ensure that the level of said signal does not exceed a threshold which may in turn lead to distortion.

BACKGROUND OF THE INVENTION

Systems for controlling the level of an audio signal are known. For example, systems for limiting the level of an audio signal are available in which the amplitude of the signal is measured in some way, usually by finding the peak of the signal and then deciding whether the peak is louder than some predetermined threshold. If the level is too loud, the audio signal is reduced but in most known systems this procedure often occurs too late.

Another known approach is to provide additional headroom for the input signal so that a relatively low level of signal may be maintained such that when peak values do occur their levels are still within the dynamic range of the system.

The first approach suffers from problems associated with distortion and the second approach suffers from problems associated with noise and inefficiency given that the full dynamic range of the system is unavailable for most normal applications.

BRIEF SUMMARY OF THE INVENTION

According to an aspect of the present invention, there is provided a method of compressing the level of an audio signal in which an audio signal is received as a stream of digital samples, each being a numerical value representing a sampled signal level. A first zero crossing point is identified and the received audio samples are stored until a second zero crossing point is identified, thereby storing a first half-wave of samples. The highest intensity sample is identified from the stored samples and this is compared against a predetermined threshold. All stored samples are scaled by an initial scaling factor so that the intensity of said highest intensity sample is not above said threshold. A second half-wave of samples is stored in which all samples of the second half-wave are below the threshold. All stored samples of the second half-wave are scaled by a first modified scaling factor derived from a combination of the initial scaling factor and a decay factor.

DESCRIPTION OF THE BEST MODE FOR CARRYING OUT THE INVENTION

FIG. 1

Figure 1:
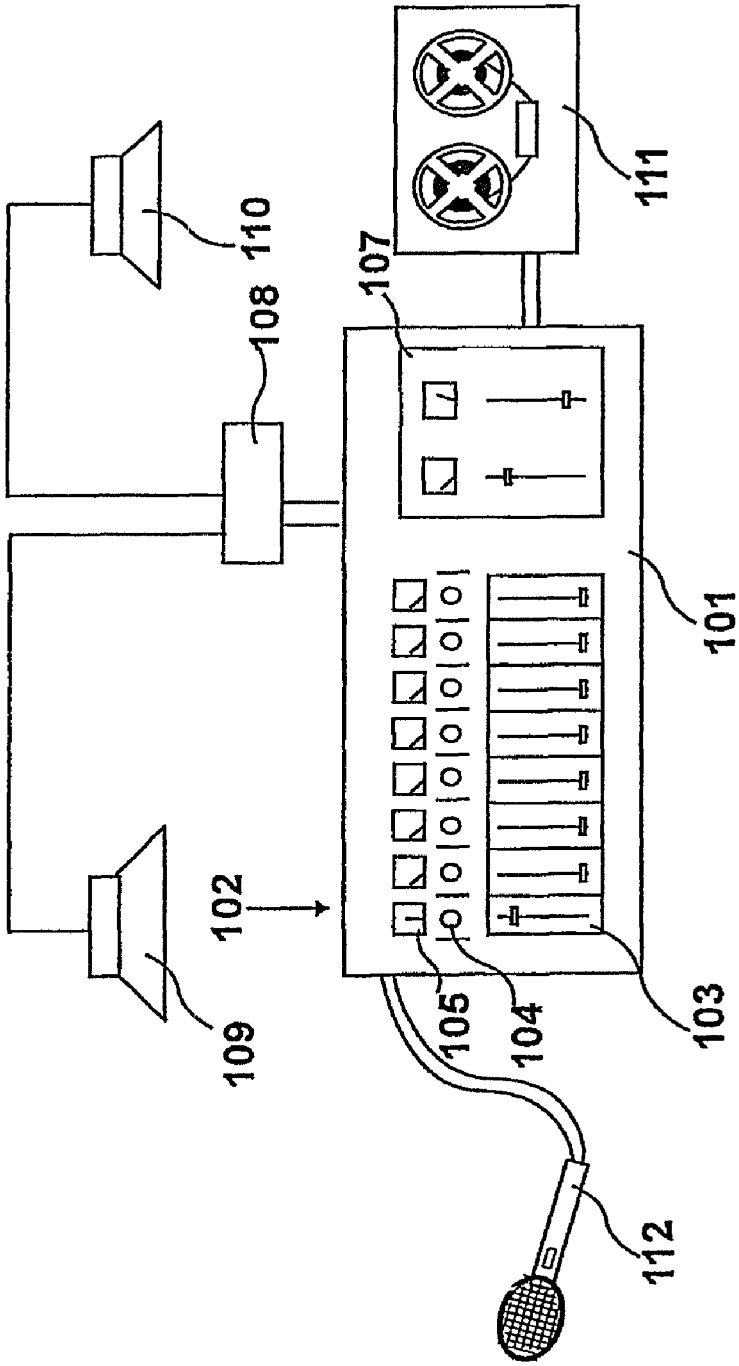
FIG. 1 shows a digital audio recording environment.

A digital audio recording environment is illustrated in FIG. 1. The environment includes a digital mixing desk or console 101 in which signal processing is performed in the digital domain, after performing an analog to digital conversion. In this example, the mixing desk 101 has eight input channels, although many professional mixing desks of this type will include substantially more.

Control and monitoring equipment for each specific channel is laid out substantially vertically and a collection of these components for a particular channel is often referred to as a channel strip. Thus, in the example shown in FIG. 1, eight channel strips, such as strip 102, are present. In this example, each channel strip includes an input volume control 103, a pan control 104 and a level indicator 105; all of which are known and represent conventional equipment in channel strips of this type.

In addition to these input controls, output sliders for the left and right channel outputs and similar monitoring units are included within an output section 107, again of conventional design. The output section provides a monitoring output to an amplifier 108 that in turn drives monitoring speakers 109 and 110. In addition, a further stereo output is provided to an audio recording device 111. A microphone 112 is shown as an example of an audio input device.

FIG. 2

Figure 2:
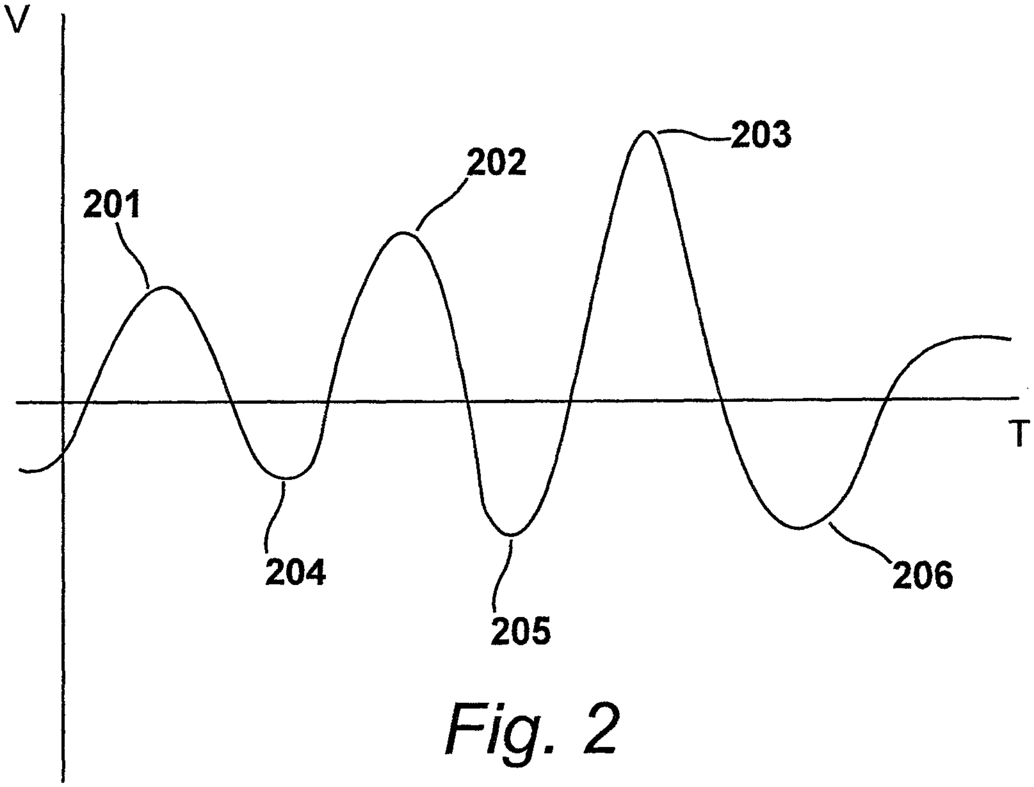
FIG. 2 shows an example of an analog input signal.

An example of an analog input signal generated by microphone 112 is illustrated in FIG. 2. In the waveform of FIG. 2, input voltage V is shown plotted against time T. The voltage therefore has positive peaks 201, 202, 203 and negative peaks 204, 205, 206. The maximum peak is 203 therefore this signal may be considered as having a dynamic range equivalent to twice the level of peak 203, given that said peak could also swing in the negative direction. However, as is well known in the art, it is possible for signals to be too large such that the full dynamic range of the signal cannot be conveyed without distortion. The resulting distortion may take many forms and is particularly undesirable in digital systems.

FIG. 3

Figure 3:
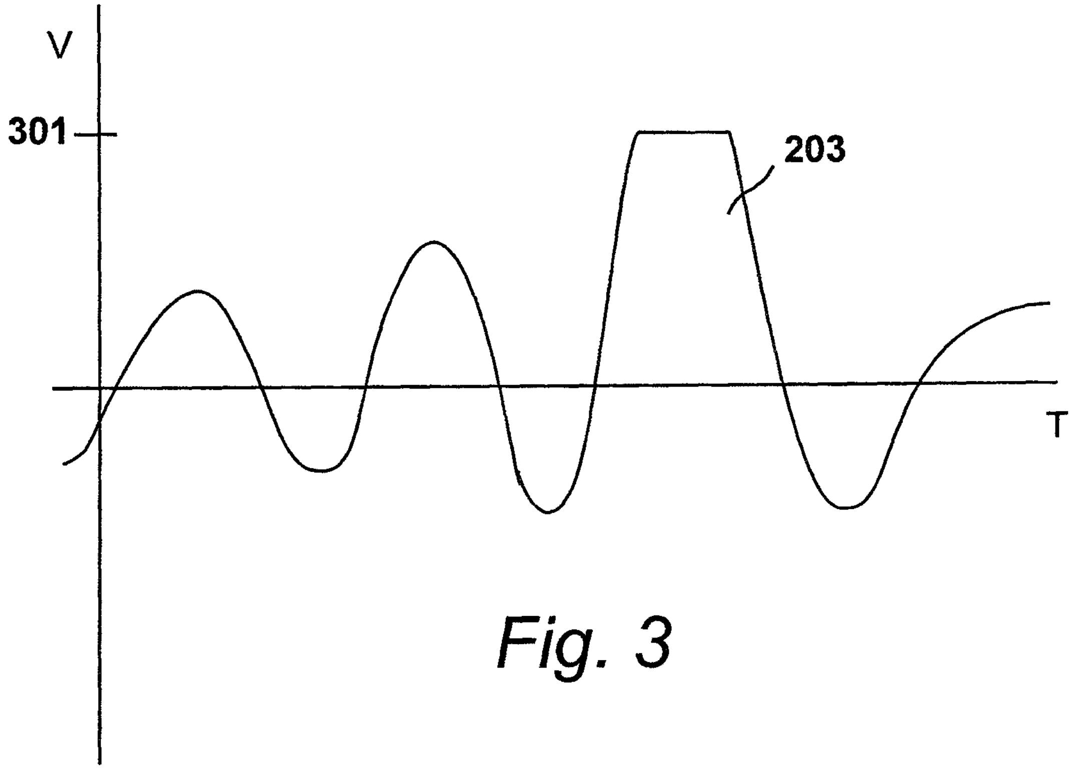
FIG. 3 shows an example of digital clipping.

An example of digital clipping is illustrated in FIG. 3. The input waveform is substantially similar to that shown in FIG. 2. However, the processing system is not capable of conveying the full dynamic range therefore the maximum peak 203 has been clipped to a maximum peak level 301. In the majority of systems, this would be considered highly undesirable therefore measures must be taken to ensure that the digital clipping does not occur.

It is known to apply audio signals to limiting circuits or limiters in which the amplitude of the signal is measured in some way, usually by finding the peak of the signal and deciding whether the peak is louder than some predefined threshold. If the signal is too loud measures are taken in order to reduce the volume of the audio signal so that the distortion does not occur.

If a sine wave is being received for example it is likely that the signal will have become too loud before the problem has been identified. Consequently, any measures taken thereafter will introduce some degree of distortion into the signal. Thus, it may be possible to reduce the harsh clipping effect illustrated in FIG. 3 but other forms of distortion will occur, resulting in the introduction of additional harmonics.

In other known systems, it is possible to make the limiter look ahead with the main signal path being delayed. In this way, it is possible for the detector to decide that the signal is too loud and then effect measures upon the delayed signal. However, known approaches introduce different artefacts in that an appropriately long delay has to be determined so as to be big enough to deal with expected overload conditions. Furthermore, known approaches tend to introduce a level of ambiguity in terms of when the limiting procedures will actually take effect.

FIG. 4

Figure 4:
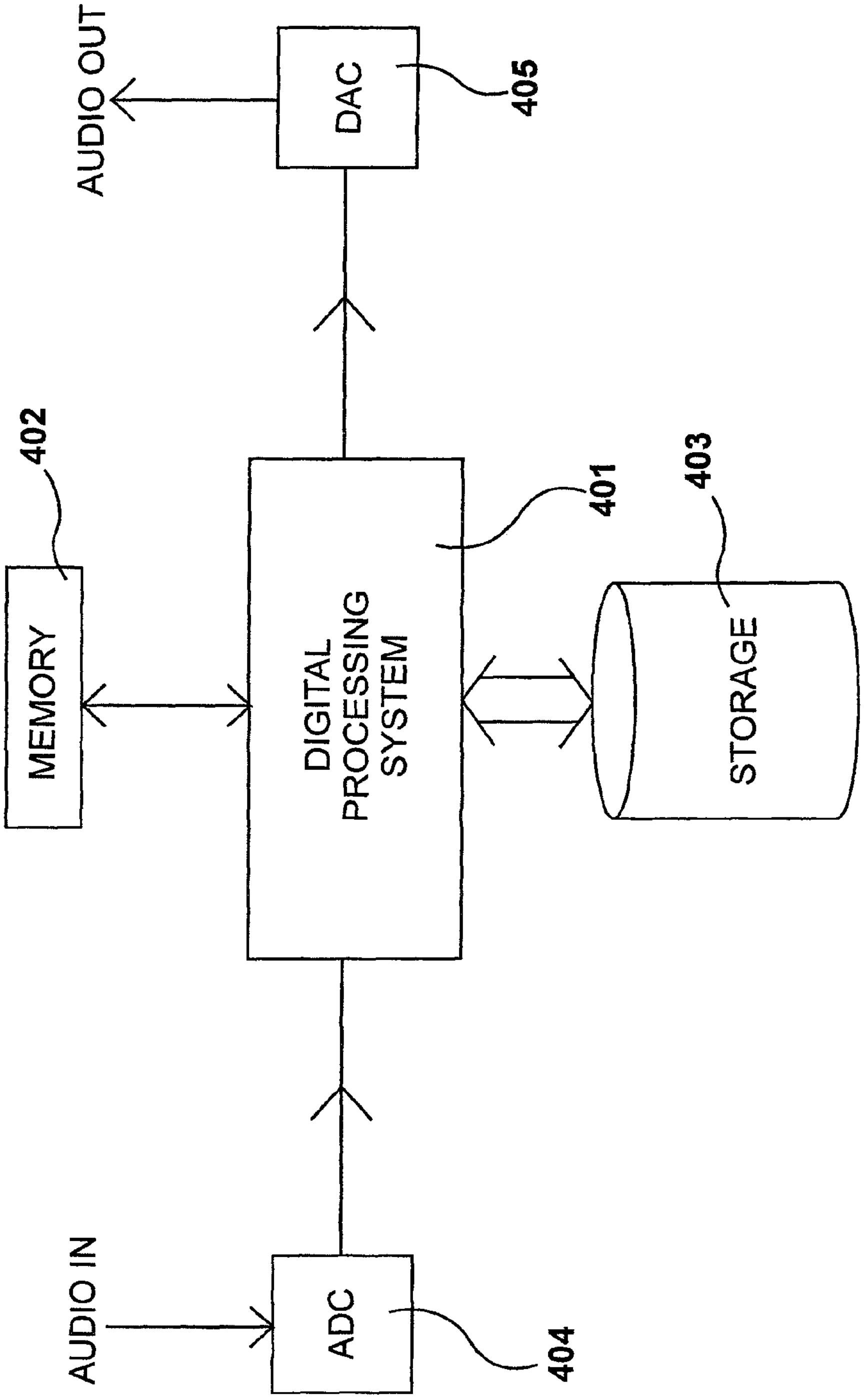
FIG. 4 illustrates an embodiment of the present invention.

An embodiment of the present invention is illustrated in FIG. 4. Signal processing is performed within the digital domain by digital processing system 401. The processing system 401 has access to temporary memory storage 402, implemented by randomly accessible devices, along with access to permanent storage 403 from which program instructions may be loaded into the digital processing system 401.

An audio input signal is supplied to an analog to digital converter 404 that in turn supplies digital samples to the digital processing system 401. Similarly, an audio output signal may be derived from the digital processing system 401 via a digital to analog converter 405.

The digital processing system 401 is configured to control the level of an audio input signal. The system 401 receives an audio signal as a stream of digital samples from the analog to digital converter 404, each being a numerical value representing a sampled signal level. The processing system 401 is programmed to identify a first zero crossing point of the audio signal. Thus, referring to FIG. 2, as the signal moves from the minimum value 205 to a maximum value 203 a zero crossing point must occur. Thus, before the zero crossing point, the received samples will have a negative sign and after the zero crossing point the received samples will have a positive sign. Consequently, by detecting this change in sign it is possible to detect that a zero crossing has taken place.

Having detected a zero crossing point, the received audio samples are buffered until a second zero crossing point is identified. Thus, after maximum level 203, the signal reduces to a minimum value 206. Again, a zero crossing point occurs therefore the preferred embodiment would store all samples making up the half cycle with peak 203.

Having buffered the samples, an analysis takes place to determine whether an adjustment is required. After making this analysis, the buffered samples are allowed to stream without adjustment or an adjustment to the level of the buffered samples is made in response to the determination. Thus, in the embodiment, a half wavelength is analysed (not a full wavelength) and by doing the half wavelength analysis it is possible to retain the shape of the waveform so as not to introduce distortion. The processing system 401 establishes a storage buffer in memory 402 of a fixed length that is capable of holding a half wave of samples at the lowest frequency of interest.

FIG. 5

Figure 5:
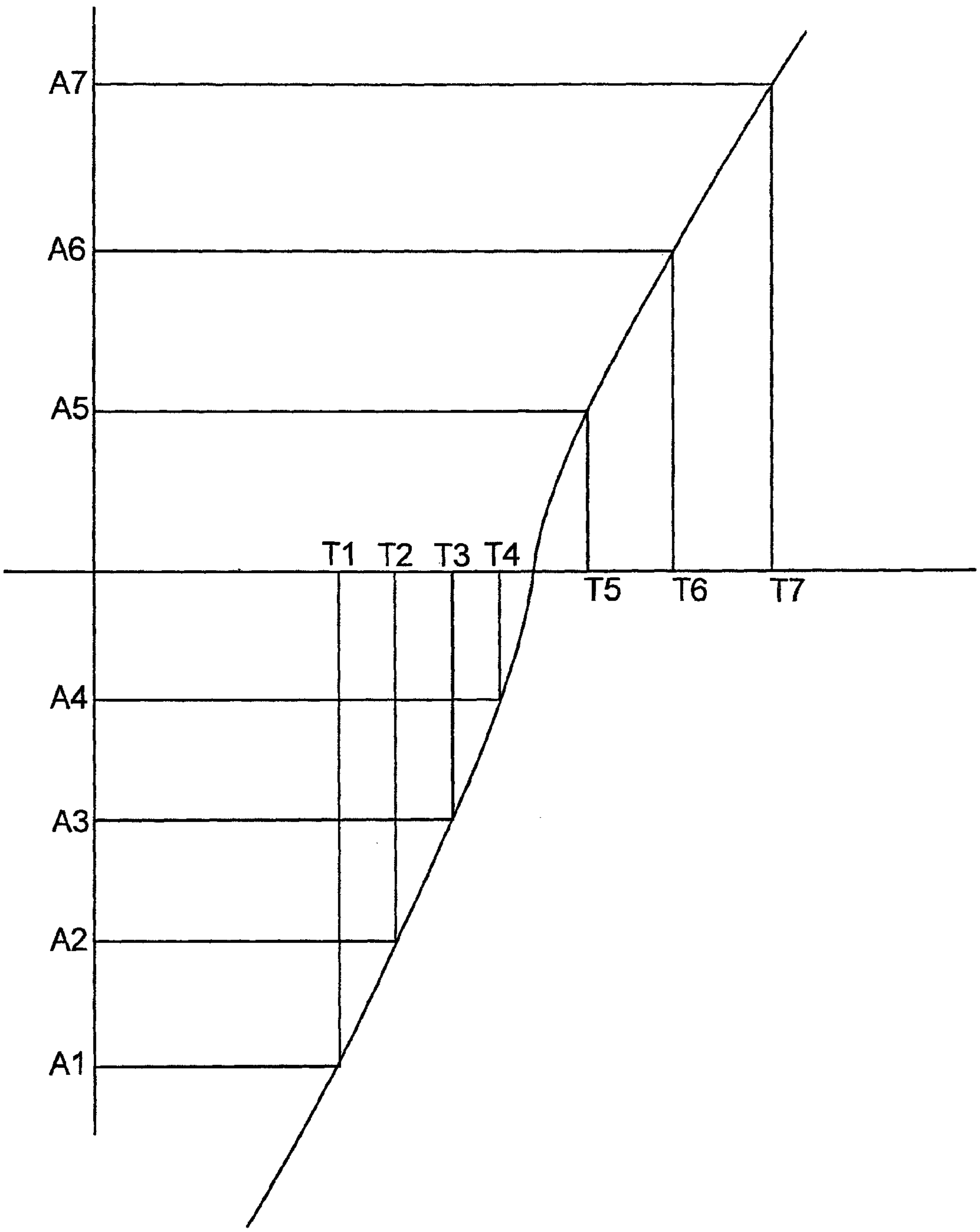
FIG. 5 illustrates a zero crossing.

An illustration of a zero crossing is shown in FIG. 5. At time T1 the waveform has a negative value A1. Similarly, at time T2 the waveform has a negative value A2. At time T3 the sample value has increased again to negative value A3 and at time T4 a further increase has occurred to give an output value of A4.

Between time T4 and time T5 the input analog waveform crosses from a negative value to a positive value. The next sample is taken at time T5 resulting in a positive value A5. At time T6 a further sample shows the waveform increasing further with a further increase taking place to give a value A7 at time T7.

The procedures performed by digital processing system 401 are such that the sign of incoming values is considered against the sign of the previous value. Thus, the system will detect a zero crossing situation by detecting the fact that the sample at time T4 was negative whereas the sample at time T5 was positive. Consequently, all samples received after and including sample A5 (A6, A7 etc) will be buffered until a zero crossing point takes place again. Thus, all samples within the half wavelength will have been buffered.

FIG. 6

Figure 6:
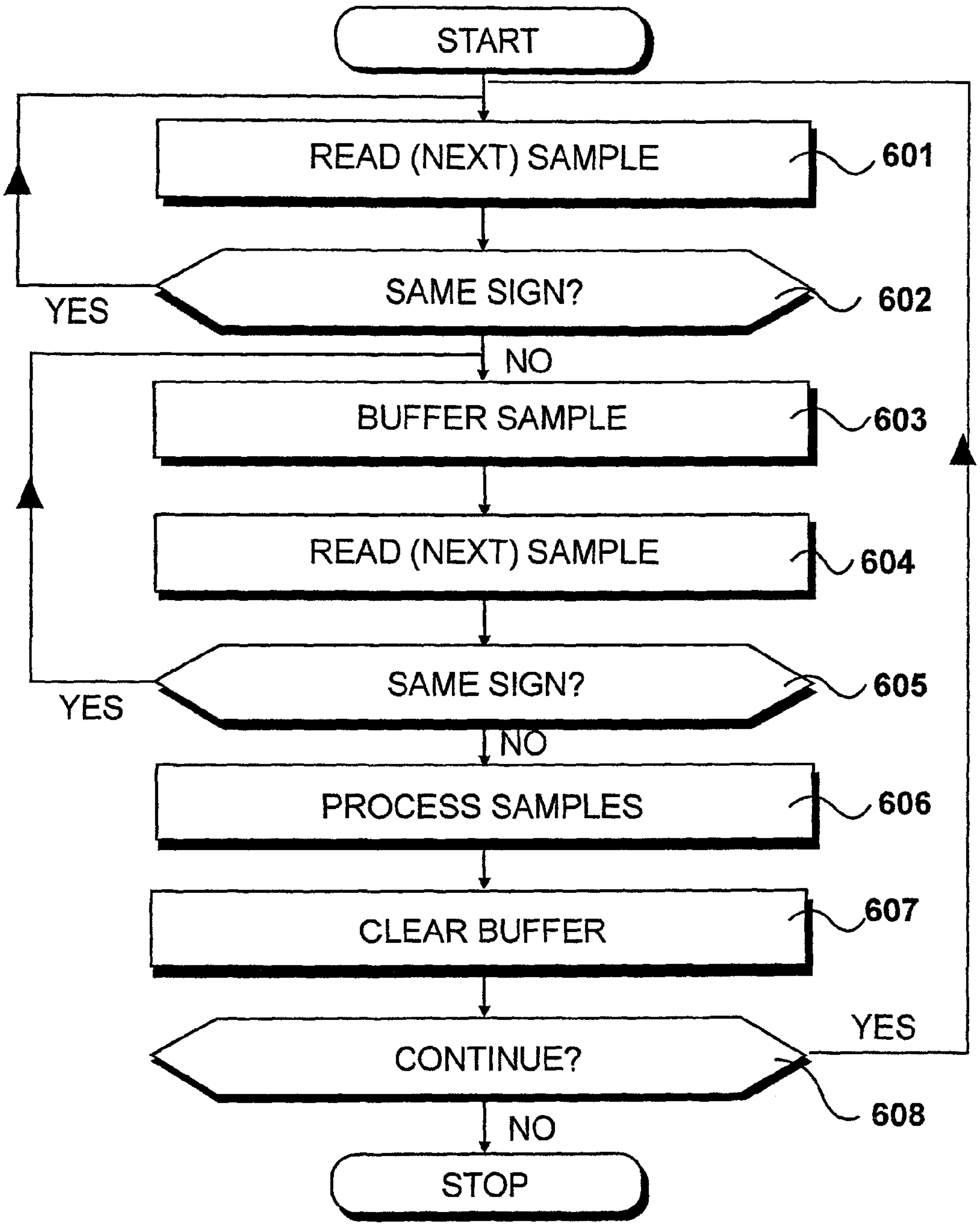
FIG. 6 details procedures performed by the processing system of FIG. 1.

Procedures performed by the digital processing system 401 when implementing a preferred embodiment of the present invention are illustrated in FIG. 6.

After the start of the process a first sample is read at step 601. Thereafter, the next sample is read at step 601 and at step 602 a question is asked as to whether the sign of the sample is the same as the previous sample. If answered in the affirmative, a zero crossing point has not occurred therefore the next sample is read at step 601.

Eventually, a zero crossing point will occur, such as when the previous sample is taken at time T4 and the current sample is taken at time T5. In this case, value A4 is negative and the next value A5 is positive. This represents a zero crossing point such that the question asked at step 602 will be answered in the negative.

At step 603 the sample read at step 601 is written to the buffer in memory 402. Thereafter, at step 604 the next sample is read and again a question is asked at step 605 as to whether the sign is the same. If the sign is the same, the sample forms part of the same half cycle (sample T6 being in the same half cycle as sample T5) therefore the sample is written to the buffer at step 603 and the next sample is read.

Eventually, the sampling process will reach the end of the current half cycle therefore the question asked at step 605 will be answered in the negative to the effect that the next sample was of a different sign.

Samples written to the buffer by repeated operations of step 603 are processed at step 606 to determine whether an adjustment is required and to make this adjustment if an adjustment is required.

Thereafter, having processed the samples at step 606, the buffer is cleared at step 607 and a question is asked at step 608 as to whether the process is to continue. When answered in the affirmative control is returned to step 601 and the next sample is read.

It should be appreciated that samples received for the next half cycle are retained in a register to allow the whole of the next half of the cycle to be buffered. In this way, every half wavelength is processed.

It should also be appreciated that the clock speed of the processing system is relatively high compared to the audio sample rate therefore it is possible for all of the procedures for FIG. 6 to be completed before it is necessary for the next sample to be written to the buffer, in the preferred embodiment.

FIG. 7

Figure 7:
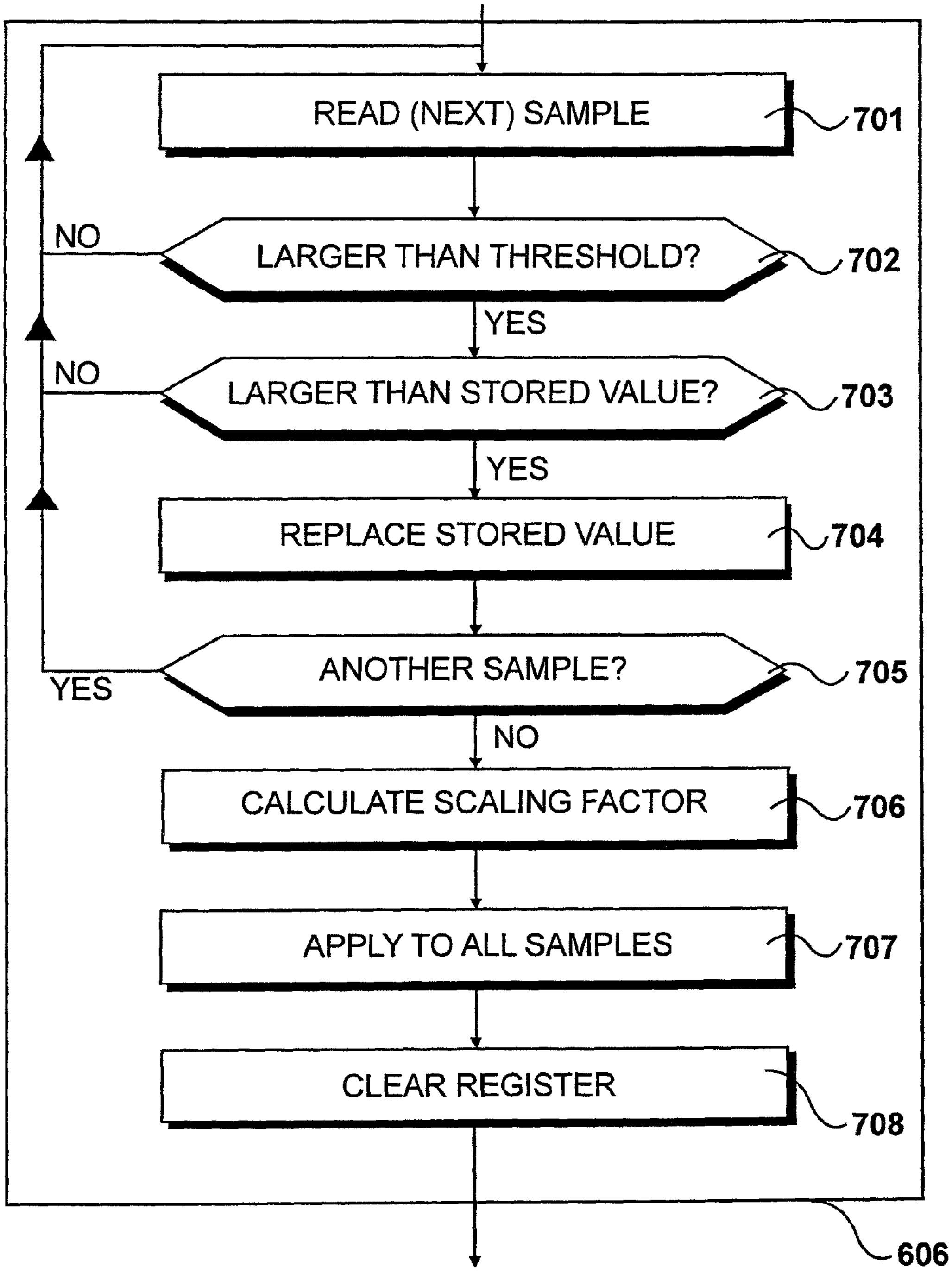
FIG. 7 shows an example of sample processing.

An example of sample processing is illustrated in FIG. 7, to effect the limiting function.

At step 701 a first sample is read from the buffer to a register and a question is then asked at step 702 as to whether the sample value is higher than the predetermined threshold.

On some half cycles none of the cycles considered will result in the question asked at step 702 being answered in the affirmative and therefore no processing will take place. However, when a large sample value occurs, such as peak 203, it is likely that at least one sample will be larger than the threshold, resulting in the question asked at step 702 being answered in the affirmative.

It is also possible that many of the samples would be larger than the predetermined threshold therefore it is necessary to identify the largest sample to ensure that said largest sample is appropriately modified. Consequently, the current largest sample is stored in a register and a question is asked at step 703 as to whether the recently received sample is larger than the current stored value.

If the question asked at step 703 is answered in the negative, control is returned to step 701 and the next sample is read. Thus, the local maximum is ignored given that a larger sample has already been retained.

However, when the question asked at step 703 is answered in the affirmative, to the effect that the new sample is larger than the previously stored sample, the new sample replaces the previous sample value at step 704. It should also be appreciated that when largeness is considered in FIG. 7 it is the modulus of the value that is being considered and the sign is ignored.

Thus, having stored a new sample at step 704, a question is asked at step 705 as to whether another sample is held in the buffer and when answered in the affirmative the next sample is read at step 701.

After all of the samples in the half wavelength have been considered, the question asked at step 705 is answered in the negative and a scaling factor is calculated at step 706.

Having calculated the scaling factor, the factor is applied to all of the samples at step 707 whereafter the register is cleared at step 708.

Thus, it can be appreciated that the procedure scans the buffered half wave for the peak value and then makes any gain adjustment necessary to the buffered samples. To achieve this, a gain reduction factor is established that has a nominal value of 1.0, that is to say the half wave peak is within limits. Consequently, if all samples within the half wave are multiplied by this amount, their values do not decrease and no gain reduction takes place. Alternatively, if the half waves peak is twice over the threshold, the gain reduction factor will be 0.5.

The gain reduction factor is therefore applied to the stored samples to produce a modified output. However, in the preferred embodiment, the gain reduction factor is not just simply calculated for each half wave in isolation as this may also introduce distortion. If, for example, half wave N has required a significant amount of gain reduction (such as resulting in a gain reduction factor of 0.5 say) but the next half wave N+1 does not have any peaks that exceed the threshold, the compression procedure is not configured to simply apply no gain reduction (a gain reduction factor of 1.0) to the half wave N+1.

If the amount of gain reduction applied for half wave N is identified as X, then the half wave N+1 gain reduction would be greater that X by an amount D, where D is a small decay factor. This mechanism allows the gain reduction amount to slowly return to a value of 1.0, thus avoiding distortion. However, if the next half wave N+1 has a requirement for more gain reduction to be applied than previously applied for half wave N, the gain reduction factor is immediately set to a new bigger value.

Thus, in a preferred embodiment, the process of FIG. 7 performs a limiting function such that an appropriate level of scaling is introduced so as to reduce the highest sample to the level of the threshold and, in addition, reduce all other sample values within the half wavelength by an equivalent scaling factor. In this way, the half wavelength is limited to the threshold value but with an equal degree of scaling being performed on the other samples so that distortion and artefacts are not introduced. Thus, although the half wavelength has been reduced in amplitude, its harmonic content remains the same.

The preferred approach compresses the level of an audio signal that is received as a stream of audio samples. The preferred aspect of the invention takes place when a compression operation is performed upon a first half-waveform such that appropriate measures may be taken on subsequent waveforms, even when compression is not necessarily required, in order to minimise distortion.

The received audio samples are stored until a second zero crossing point is identified, thereby storing a first half-wave of samples. The highest intensity sample is identified and this highest intensity value is compared against a predetermined threshold. Given that the highest intensity sample is above the threshold (and other samples may be above the threshold) all stored samples are scaled by an initial scaling factor so that the intensity of the highest intensity sample is not above the threshold.

A second half-wave of samples is stored in which, for this preferred aspect to take effect, all the samples of the second half-wave are below the threshold. Consequently, it is not necessary to compress this half-wave but given that the previous half-wave was compressed an undesirable artefact will be introduced if it is allowed to pass without modification. Consequently, all stored samples of the second half-wave are scaled by a first modified scaling factor derived from a combination of the initial scaling factor and a decay factor.

It is possible for this additional scaling to continue (to a lesser extent) for the next half cycle. Thus, in a preferred embodiment, a third half-wave of samples is stored in which all of these samples are below the threshold. However, scaling is performed upon all of the stored samples of the third half-wave but by a second modified scaling factor derived from a combination of the first modified scaling factor and a decay factor. Thus, scaling may continue until the decay factor becomes smaller than the definition of the system.

Alternatively, it is possible that the third half-wave of samples may itself contain a sample that is above the threshold. When this situation arises, the process is effectively reset such that all of the stored samples of the third half-wave are scaled by newly calculated initial scaling factor without reference to a previous scaling factor.

Thus, in the preferred embodiment, immediate action is taken to ensure that no samples are above the predetermined threshold, thereby compressing the signal to ensure that distortion does not occur. Thereafter, further scaling occurs (even when not necessary to prevent distortion) by a decaying amount on each half cycle thereby reducing the presence of undesirable artefacts.

FIG. 8

Figure 8:
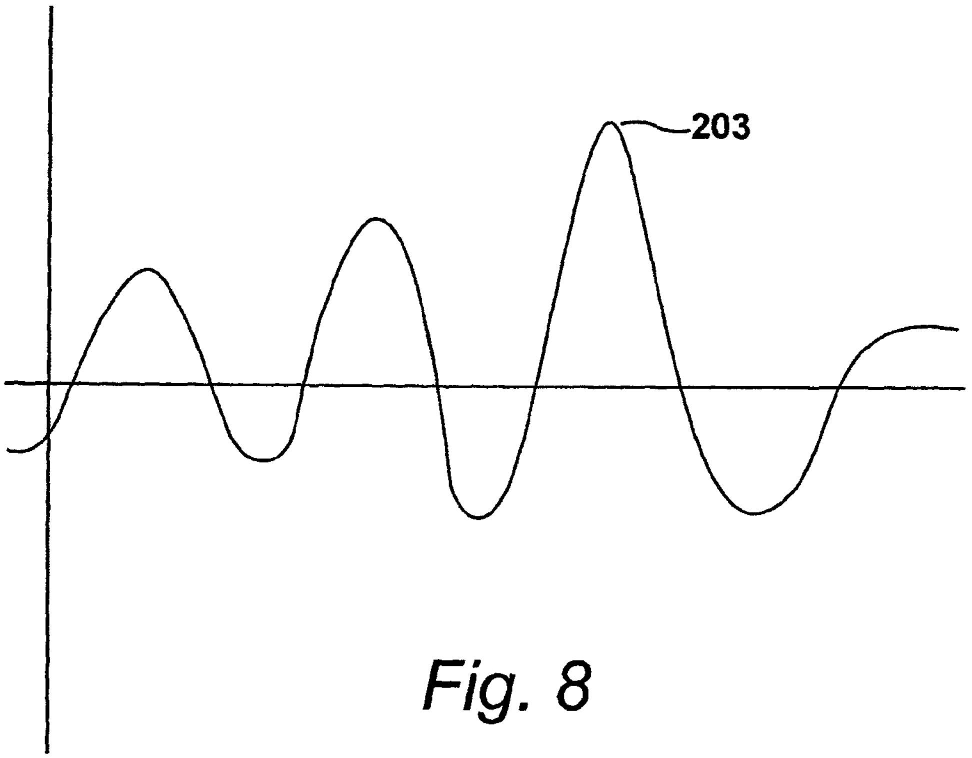
FIG. 8 reproduces the waveform of FIG. 2.

The incoming waveform of FIG. 2 is reproduced in FIG. 8, illustrating peak value 203. Unprocessed, it is possible for this peak value to clip, as illustrated in FIG. 3,

FIG. 9

Figure 9:
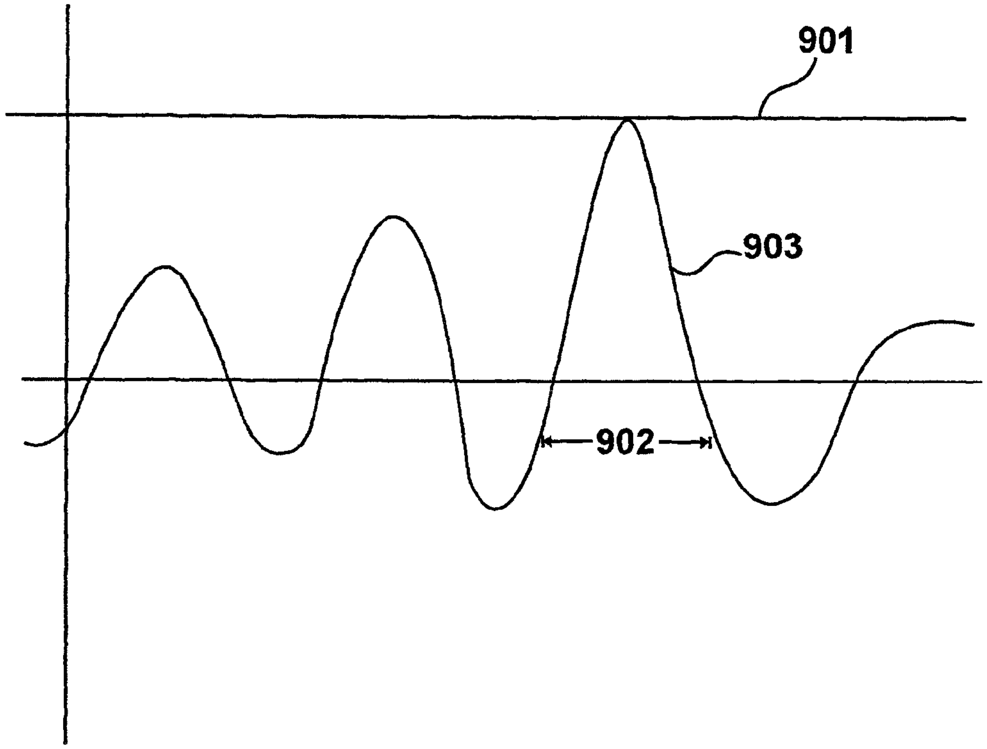
FIG. 9 illustrates the effect of a processing procedure.

In this example, the waveform of FIG. 8 has been processed in accordance with the procedures shown in FIG. 6, to produce the waveform of FIG. 9. A signal has been limited to a threshold value 901. Thus, peak value 203 has been scaled to the threshold value 901. Furthermore, all other sample values within the half cycle 902 have been scaled, resulting in processed half waveform 903. Thus, all of the sample values within the half cycle 902 have been scaled such that the overall amplitude has been reduced (to a maximum of threshold value 901) while retaining the shape of the wave and thereby retaining the harmonic content.

A similar approach may be taken in order to achieve compression as distinct from limiting. When performing compression, the size of the high signals is reduced but the resulting output is still higher than the threshold value. Thus, subject to an adjustment being made, it is possible for an alternative scaling factor to be calculated such that the level of compression for the illustrated waveform may result in a peak value being allowed to pass through the system that lies somewhere between the peak value 203 and the threshold value 901.

FIG. 10

Figure 10:
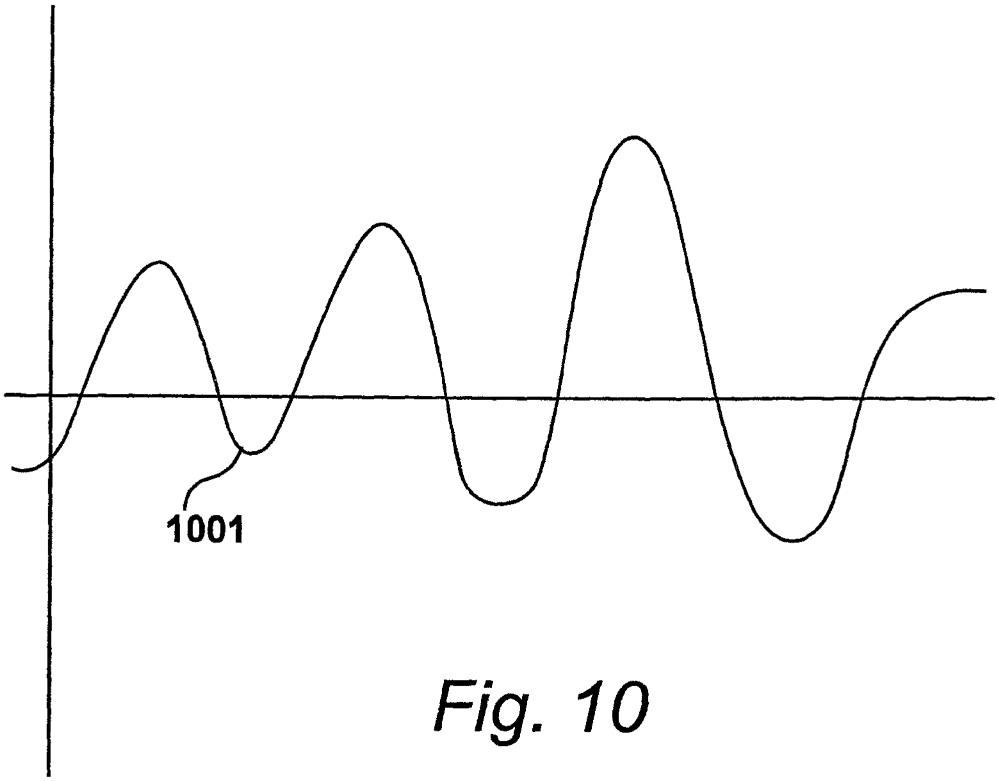
FIG. 10 shows a waveform substantially similar to that shown in FIG. 8.

A waveform substantially similar to that of FIG. 8 is illustrated in FIG. 10. For the purposes of this illustration, it is assumed that the waveform has a relatively low amplitude peak 1001. For the application under consideration, this low level is considered to be too small and during reproduction would tend to be lost due to the presence of noise. This noise may be present within the system itself or it may be due to external sources. To overcome this problem, it is possible to expand the signal.

FIG. 11

Figure 11:
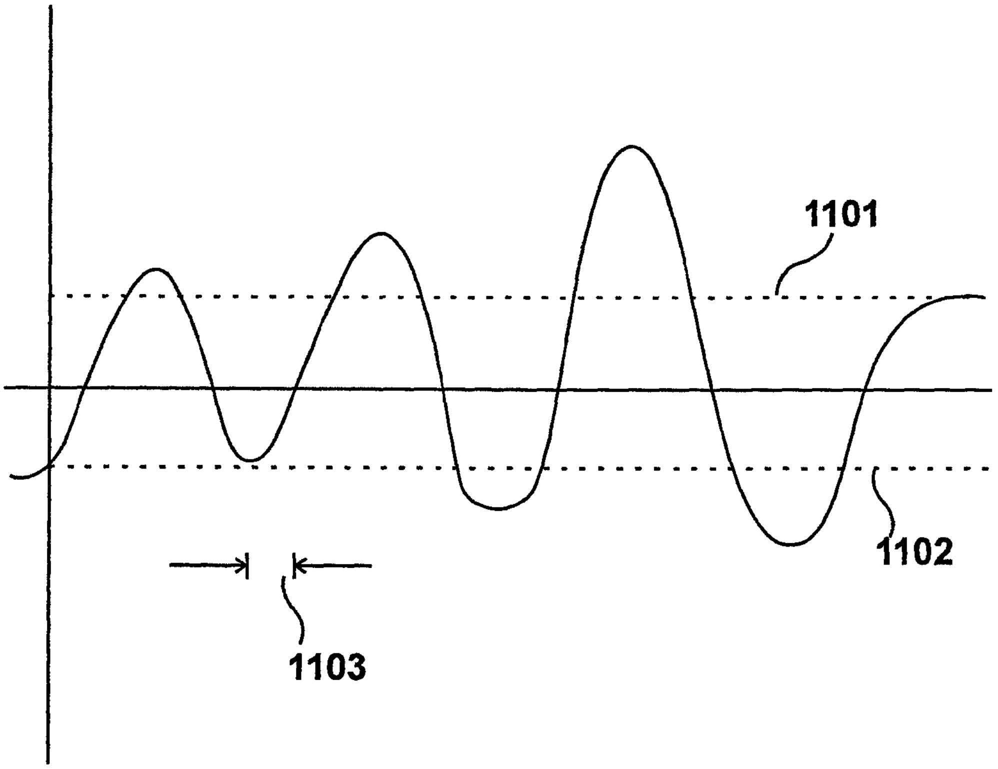
FIG. 11 illustrates the effect of processing upon the waveform shown in FIG. 10.

As illustrated in FIG. 11, a first positive threshold 1101 has been established along with a negative threshold threshold 1102. A detection process is performed similar to that illustrated in FIG. 6, whereupon peak 1001 is detected as being smaller in magnitude than the negative threshold 1102. As a consequence, a scaling value is calculated for all of the samples in half wavelength 1103 such that the peak value at 1001 is expanded to the threshold value 1102, with appropriate scaling being performed upon the other samples so as to retain the harmonic content.

What I claim is:

1. A method of controlling the level of an audio signal, comprising the steps of:

receiving an audio signal as a stream of digital samples, each being a numerical value representing a sampled signal level;

identifying a first zero crossing point;

storing said digital samples until a second zero crossing point is identified, thereby storing a first half-wave of samples;

identifying the highest intensity sample of said stored samples and comparing said highest intensity against a threshold intensity;

scaling all stored samples of said first half-wave by an initial scaling factor so that the intensity of said highest intensity sample is not above said threshold intensity;

storing a second half-wave of samples in which all samples of said second half-wave are below said threshold intensity; and scaling all stored samples of said second half-wave by a first modified scaling factor derived from a combination of said initial scaling factor and a decay factor.

2. The method as claimed in claim 1, further comprising the steps of:

storing a third half-wave of samples in which all samples of said third half-wave are below said threshold intensity; and scaling all stored samples of said third half-wave by a second modified scaling factor derived from a combination of said first modified scaling factor and said decay factor.

3. The method as claimed in claim 1, further comprising the steps of:

storing a third half-wave of samples in which a sample of said third half-wave is above said threshold intensity; and scaling all stored samples of said third half-wave by a newly calculated initial scaling factor without reference to a previous scaling factor.

4. The method as claimed in claim 1, wherein said threshold intensity is a first threshold intensity that is defined as a compression threshold intensity, and a second threshold intensity is defined as an expanding threshold intensity, such that:

all values below said first threshold intensity are reduced by a compression factor, and all values below said second threshold intensity are increased by an expansion factor.

5. The method as claimed in claim 1, wherein said step of scaling stored samples of said first half-wave includes the step of multiplying each sample by a scaling factor of between zero and unity.

6. The method as claimed in claim 1, wherein said threshold intensity is a limiting threshold intensity and all of said stored samples are scaled such that the highest value sample is reduced to the limit of said limiting threshold intensity.

7. The method as claimed in claim 1, wherein said threshold intensity is a compressing threshold intensity, such that all values above said compressing threshold intensity are reduced by a compression factor.

8. The method as claimed in claim 1, wherein said threshold intensity is an expanding threshold intensity, such that all values below said expanding threshold intensity are increased by an expansion factor.

* * * * *